United States Patent [19]
Cotler et al.

[11] Patent Number: 5,382,911
[45] Date of Patent: Jan. 17, 1995

[54] REACTION CHAMBER INTERELECTRODE GAP MONITORING BY CAPACITANCE MEASUREMENT

[75] Inventors: Tina J. Cotler, Ramsey, N.J.; John C. Forster, Poughkeepsie, N.Y.; Lawrence A. Kropp, Pleasant Valley, N.Y.; Jyothi Singh, Hopewell Junction, N.Y.

[73] Assignee: International Business Machines Corporation, Armonk, N.Y.

[21] Appl. No.: 37,879

[22] Filed: Mar. 29, 1993

[51] Int. Cl.$^6$ ............................................. G01R 27/26
[52] U.S. Cl. .................................. 324/662; 324/661; 324/684; 364/571.07
[58] Field of Search ............... 324/457, 658, 661, 662, 324/684; 364/571.07; 73/1 J; 204/298.03, 298.15, 298.32, 298.34; 422/186, 186.15, 186.27; 427/8, 569; 118/723 E; 156/45, 626, 627

[56] References Cited

U.S. PATENT DOCUMENTS

| | | | |
|---|---|---|---|
| 3,031,617 | 4/1962 | Paquette | 324/662 |
| 3,736,647 | 6/1973 | Roeder et al. | 324/662 X |
| 4,067,225 | 1/1978 | Dorman et al. | 73/1 |
| 4,461,239 | 7/1984 | Cannella et al. | 118/718 |
| 4,555,661 | 11/1985 | Benson et al. | 324/684 X |
| 4,804,905 | 2/1989 | Ding et al. | 324/662 |
| 4,855,667 | 8/1989 | Hendrick et al. | 324/661 X |
| 4,931,887 | 6/1990 | Hegde et al. | 324/662 X |

FOREIGN PATENT DOCUMENTS

| | | | |
|---|---|---|---|
| 0187619 | 8/1988 | Japan | 118/723 E |
| 1411686 | 7/1986 | U.S.S.R. | |

Primary Examiner—Gerard R. Strecker
Assistant Examiner—Diep Do
Attorney, Agent, or Firm—Michael J. Balconi-Lamica

[57] ABSTRACT

A non-intrusive means and method are disclosed for monitoring the interelectrode gap in a reaction chamber containing a pair of variably spaced, nominally parallel reaction-sustaining electrodes. An example is given in which the chamber is a plasma enhanced chemical vapor deposition chamber. The electrodes are treated as a parallel plate capacitor in order to measure the gap therebetween as well as the parallelism of the electrodes without requiring that the chamber be opened. A calibration curve is prepared by ascertaining known values of gaps by use of spacer gauges and then measuring and storing the corresponding values of the gaps and the capacitances. Once the calibration curve is established and stored, the spacing between the electrodes can be checked from time to time, as needed, without opening the chamber. It is only necessary to measure the capacitance existing and then refer the measured value to the stored values to read out the corresponding gap value. By making several capacitance measurements, a new curve can be made from time to time which can be compared as to slope with the stored calibration curve to check the parallelism of the electrodes.

5 Claims, 2 Drawing Sheets

REACTION CHAMBER INTERELECTRODE GAP MONITORING BY CAPACITANCE MEASUREMENT

BACKGROUND OF THE INVENTION

The invention generally relates to the monitoring of electrode spacing in semiconductor wafer reaction chambers and, more particularly, to a non-intrusive technique which does not require that the chamber be opened for direct measurement using gauges or for indirect measurement using depositions upon monitor wafers.

Interelectrode gap spacing is a critical parameter in certain reaction chambers such as, for example, plasma enhanced chemical vapor deposition (PECVD) chambers. The parallelism and spacing of the plate electrodes in PECVD chambers affects the physics and the chemistry of the plasma discharge due to changes in the power density, residence time, etc., and strongly impacts the uniformity of the film thickness deposited across the wafers placed therein. When the chamber is in continuous use, the preestablished electrode spacing and parallelism may drift with time away from the desired settings. Consequently, the electrode spacing and parallelism needs to be checked periodically. It also has been noted that the interelectrode gap is sometimes inadvertently disturbed when routine or other maintenance is done on the chamber.

Conventional procedures used for checking the electrode spacing and parallelism require that the chamber be opened to allow the insertion of a calibrated spacing bar. This approach involves a cooling cycle and purging the system before the chamber can be opened. An alternative technique utilizes the running of a spacing matrix where the spacing is varied in small increments, e.g., 5 mil increments over a range of 20 mils, and the resulting film uniformity is observed on monitor wafers. The latter method requires the use of a fair number of monitor wafers which is an added expense. Both methods typically can take up to four hours, not including the time necessary to pump all atmospheric contaminants out of the system again, and bring the chamber to thermal equilibrium at the desired process temperature.

SUMMARY OF THE INVENTION

One object of the present invention is to provide a non-intrusive means and method for monitoring the interelectrode plate spacing in a semiconductor wafer reaction chamber.

Another object is to provide a non-intrusive means and method for monitoring the interelectrode plate spacing in a plasma enhanced chemical vapor deposition (PECVD) chamber.

These and other objects of the present invention are achieved in a preferred embodiment by treating the parallel plate electrode system already in place in PECVD chambers as a parallel plate capacitor. Although there are also some secondary distributed capacitive effects at play in the chamber, the parallel plate electrode system is the predominant capacitor which changes value when plate spacing is changed or varied.

The capacitance of said capacitor is measured and is converted into the value of the gap distance "d" between the plates by means of a preestablished calibration curve. As is well known, capacitance between parallel plates is inversely related to the gap between the plates.

The above-noted calibration curve is employed to evaluate "d" from a capacitance meter-measured value of "C". The calibration curve, in turn, is preestablished by initially ascertaining known values of "d" with the aid of spacer gauges, for example, and then measuring and storing the corresponding values of "C" resulting therefrom when no wafers are in place between the plates. The spacer gauges also establish the necessary parallelism between the opposing plates within the reaction chamber.

Once the calibration curve is established and stored, the spacing and parallelism between the plates can be checked from time to time, as needed, without opening the reaction chamber. In the absence of a wafer (or wafers) on the lower electrode plate, a capacitance value ("C") is measured between the empty plates. The measured "C" is then referred to the stored "d" values curve to determine the corresponding value of "d". Should a wafer (or wafers) be present on the lower plate at the desired time for checking the spacing or parallelism between the plates, the wafer is removed from the lower plate by conventional internal robotic action. By making several "C" measurements, a new curve is experimentally derived which can be compared as to slope with the stored calibration curve to check the parallelism of the plates as well.

BEST MODE FOR CARRYING OUT THE INVENTION

Figure 1:
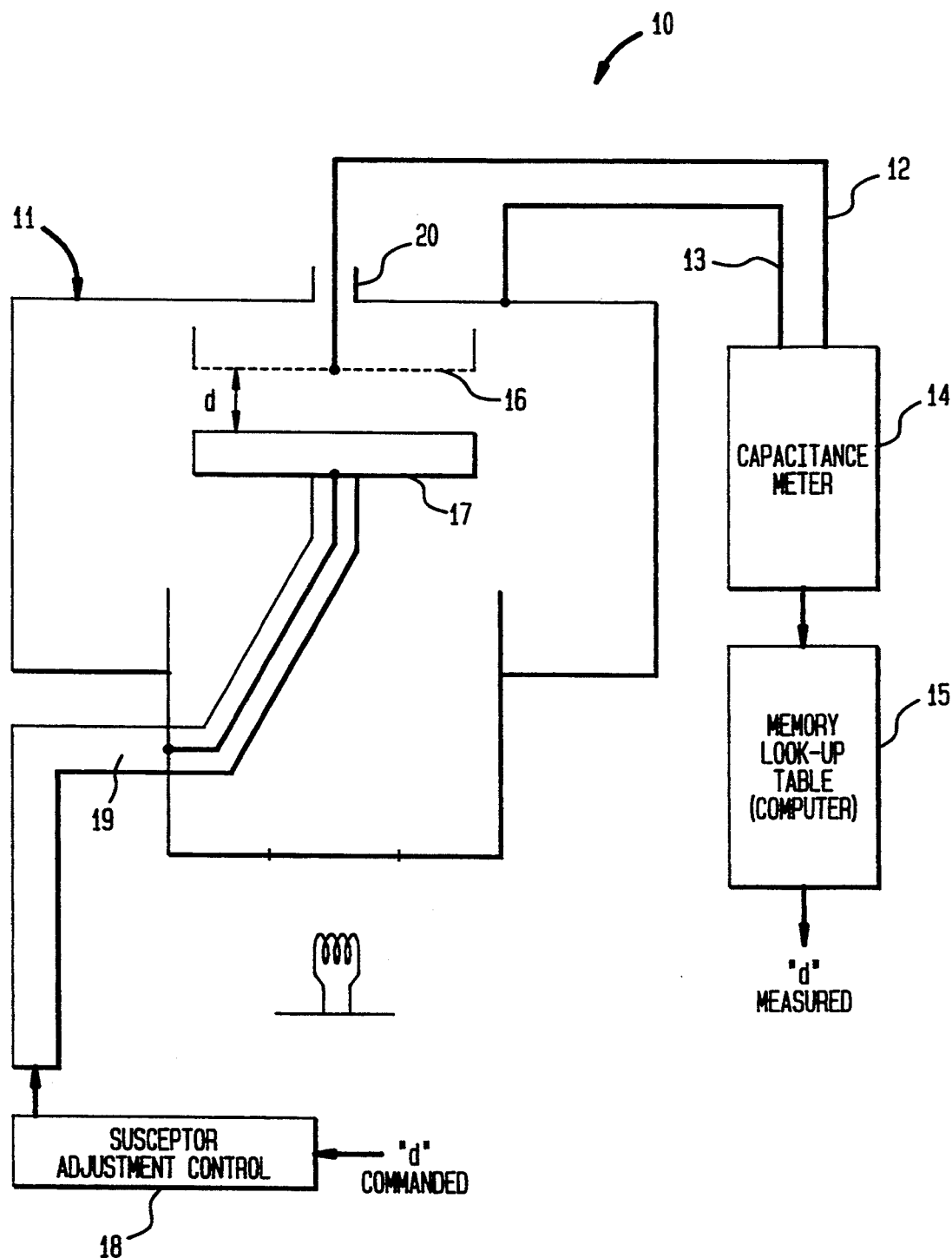
FIG. 1 is a simplified cross-sectioned view of a reaction chamber equipped, in accordance with the present invention, for the non-intrusive determination of plate spacing.

Referring to FIG. 1, a semiconductor wafer reaction chamber 11, comprising for example, a plasma enhanced chemical vapor (PECVD) deposition chamber is shown. Chamber 11 is conventional and is commercially available. Chamber 11 is equipped internally with a pair of plates 16 and 17 which are treated also as capacitor electrodes in accordance with the present invention. Plate 16 is apertured to admit gas for the establishment of a plasma within the space between the plates as is the standard practice in plasma enhanced deposition processes. A wafer or wafers (not shown) are placed upon the lower plate (susceptor) 17 for the deposition of a desired layer of material as is well known. The separation of movable plate 17 relative to fixed plate 16 is set under the control of stepper motor 18 which is mechanically linked via a bellow vacuum feedthrough 19 to plate 17. The position of plate 16 is fixed relative to chamber 11. Plate 16 is also electrically isolated from chamber 11. In addition, plate 17 is grounded electrically to the walls of chamber 11.

A capacitance meter 14, comprising any commercially available suitable capacitance meter or other suitable means for measuring capacitance, is connected across plates 16 and 17 for measuring the capacitance "C" therebetween. First and second electrical connection means 12 and 13, respectively, comprise suitable electrical wires for electrically connecting capacitance meter 14 across plates 16 and 17, respectively. Note that electrical connector 13 is shown connected to a chamber wall instead of directly to bottom electrode plate 17. Recall that electrode plate 17 is electrically grounded to the walls of chamber 11.

Memory look-up table 15 can comprise any suitable memory device, such as a computer, for storing preestablished calibration curve values of capacitance versus interelectrode (plates 16, 17) spacing. Memory look-up table 15 receives measured values of "C" from capacitance meter 14 and outputs a corresponding measured electrode plate spacing distance "d". The output of look-up table 15 corresponding to measured distance "d" can be visually displayed or electrically output to other equipment for further use thereby.

In operation, the stepper motor is commanded by susceptor adjustment control 18 to a step setting nominally corresponding to a desired spacing or distance "d" between plates 16 and 17. Control 18 essentially is a computer which executes a stored relationship to translate an input command representing "d" into a corresponding electrical drive signal for positioning the stepper motor. Provision is made for introducing a calibration factor into the stored relationship by adjusting the value of a stored constant. In a preferred embodiment of the present invention, the aforesaid value is ascertained by the capacitance measurement technique previously described for deriving the distance "d" and noting the difference between the commanded "d" and the measured "d". The commanded "d" and the measured "d" coincide when the stored constant is properly set. Capacitance meter 14 is connected electrically across plates 16 and 17 by attaching the wire 13 to the grounded walls of chamber 11 and the wire 12 to fixed plate 16 via feedthrough 20. A signal representing the measured value of capacitance is generated by meter 14 and is applied to look-up table memory 15 wherein it is converted into a corresponding value of "d" for display to a maintenance engineer. The maintenance engineer, in turn, can then compare the displayed value with the desired "d" and make an appropriate adjustment in the value of the stored constant, if necessary. It should be noted that the measurement of capacitance to determine what adjustment, if any, is required to restore accurate calibration of the stepper motor in response to commanded values of "d" is only done from time to time at the discretion of the maintenance engineer. Interruption of the "up-time" status of the PECVD reaction chamber is minimal. It is only required that the R. F. power to the chamber be shut off and that any wafers on the susceptor plate 7 be routinely moved elsewhere by the internal robotics (not shown) which are provided as part of the commercially available PECVD chamber. A suitable chamber is the AME 5000 deposition tool available from Applied Material Inc. of Santa Clara, Calif.

Although the "d" monitoring technique of the present invention has been described particularly in the context of a deposition (PECVD) chamber, the technique also is applicable to etching chambers when it becomes necessary to check plate spacing. However, the sensitivity of the technique is somewhat lower in the latter case because of the larger interelectrode gaps typical in etch plasmas.

Figure 2:
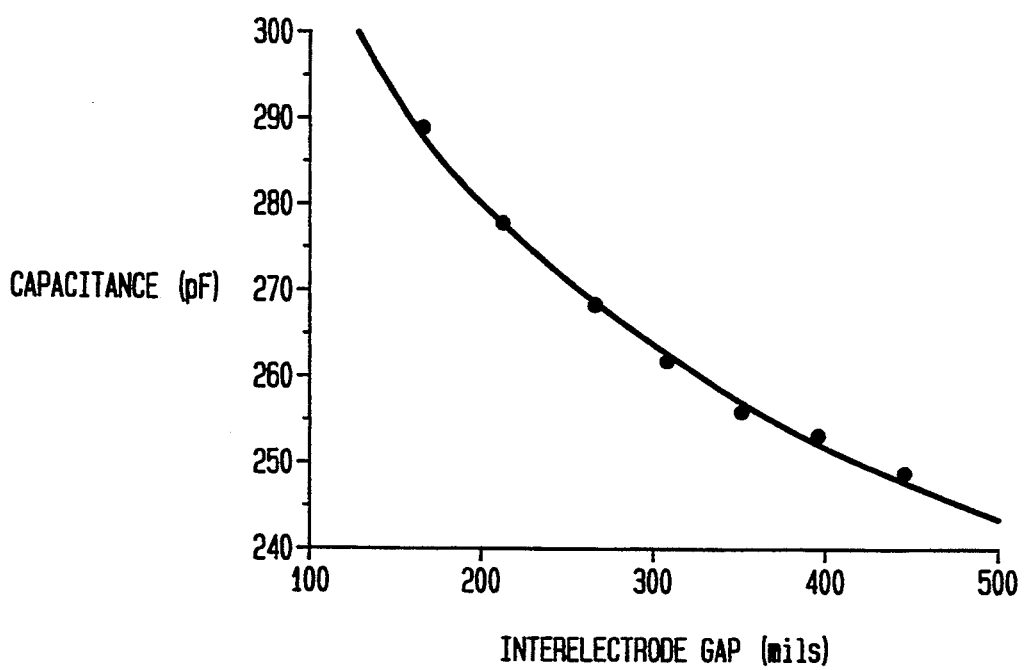
FIG. 2 is a typical curve showing a typical relationship between measured values of capacitance and plate spacing within the chamber of FIG. 1.

Referring now to FIG. 2, a typical relationship between measured capacitance values and corresponding interelectrode gap values is shown. It will be observed that the sensitivity (slope) of the capacitance to changes in gap setting is greatest when the gap settings are small.

Figure 3:
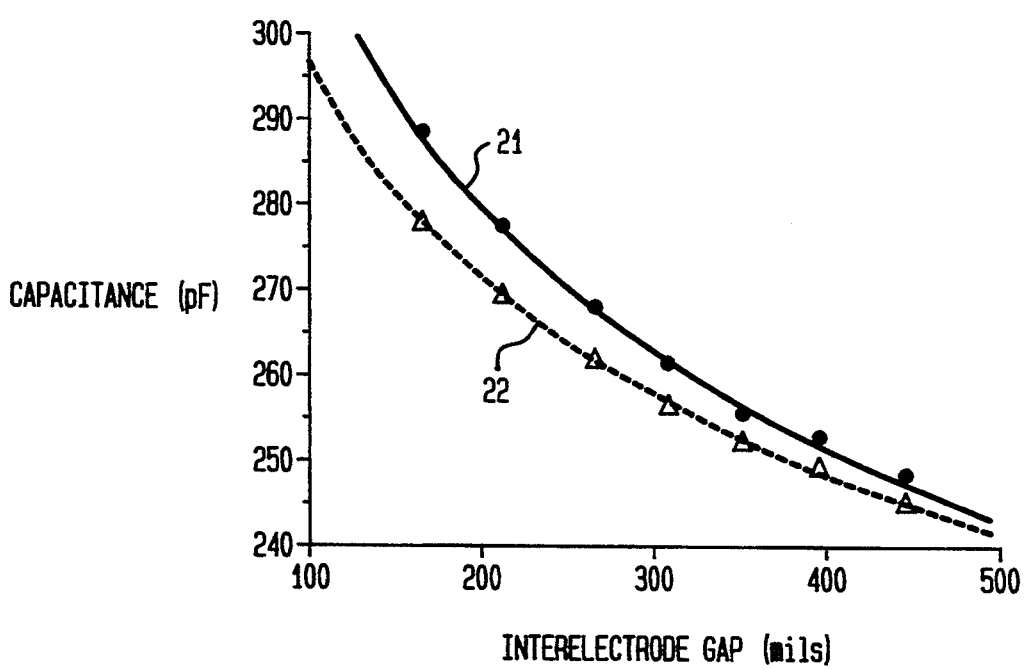
FIG. 3 is a typical pair of curves (capacitance versus plate spacing) contrasting the values obtained when the plates within the chamber of FIG. 1 are parallel with the values obtained when the plates are skewed relative to each other.

FIG. 3 illustrates two curves representative of instances wherein plates 16 and 17 are parallel or skewed relative to each other: Reference curve 21 (similar to the values stored in memory 15) results from plates 16 and 17 of FIG. 1 being parallel to each other. Curve 22 results when plates 16 and 17 are skewed relative to each other, i.e., five values of "d" are commanded, and the corresponding measured values of "C" are plotted and compared against stored values of "C" for the same five values of commanded "d". It will be noted that the curves 21 and 22 are of different curvature and are convergent, indicating that plates 16 and 17 are non-parallel. The amount of skew or non-parallelism of plates 16 and 17 is determined by an amount of difference between corresponding points on curves 21 and 22, the difference being greater than a preestablished acceptable value for a particular reaction process. Thus, the degree or magnitude of skew or parallelism between plate electrodes 16 and 17 can be advantageously determined also (e.g., skewed or not skewed). Thus, the present invention provides for a single measurement technique for calibrating "d" when plates 16 and 17 are parallel and a multiple measurement technique for ascertaining the parallelism or skew of plates 16 and 17.

While the invention has been particularly shown and described with reference to the preferred and alternate embodiments thereof, it will be understood by those skilled in the art that various changes in form and detail may be made therein without departing from the spirit and scope of the invention.

We claim:

1. Apparatus for monitoring the interelectrode gap in a reaction chamber containing a pair of variably spaced nominally parallel reaction-sustaining electrodes, said apparatus comprising:

means connected to said electrodes for measuring the effective capacitance therebetween, said capacitance measuring means comprising a capacitance meter;

memory look-up table means connected to said capacitance measuring means for providing a signal representing the value of said gap corresponding to said measured effective capacitance, said table means storing a calibrating set of measured values of capacitance corresponding to measured values of gaps, said memory look-up table means further provides a signal representing an amount of parallelism between said electrodes, said table means providing a comparison of multiple commanded gap "d"s with measured gap "d"s wherein a difference between commanded and measured "d" greater than a preestablished amount is indicative of the amount of parallelism.

2. The apparatus defined in claim 1 wherein said chamber is a plasma enhanced chemical vapor deposition chamber.

3. A method for monitoring the interelectrode gap in a reaction chamber containing a pair of variably spaced nominally parallel reaction-sustaining electrodes, said method comprising the steps of:

measuring an effective capacitance between said electrodes with a capacitance meter;

preparing a calibrating table of measured values of capacitances corresponding to measured values of gaps;

determining from said table the value of said gap corresponding to said measured effective capacitance;

choosing values of said gap and determining from said table the values of capacitance corresponding thereto;

varying said gap through said gap values and measuring the values of capacitance resulting therefrom; and comparing said determined and said measured values of capacitance, wherein a difference between determined and said measured values of capacitance greater than a preestablished amount is indicative of an amount of parallelism between said electrodes.

4. A reaction chamber having non-intrusive interelectrode gap monitoring of the gap between a pair of variably spaced nominally parallel reaction-sustaining electrodes, said chamber comprising:

means connected to the electrodes for measuring the effective capacitance therebetween, the effective capacitance being a function of interelectrode gap, said capacitance measuring means comprising a capacitance meter;

means for converting the effective capacitance into a measured unit of gap spacing, said converting means comprising memory look-up table means connected to said capacitance measuring means for providing a signal representing the value of said gap corresponding to said measured effective capacitance, said table means storing a calibrating set of measured values of capacitance corresponding to measured values of gaps, said memory look-up table means further provides a signal representing an amount of parallelism between said electrodes, said table means providing a comparison of multiple commanded gap "d"s with measured gap "d"s wherein a difference between commanded and measured "d" greater than a preestablished amount is indicative of the amount of parallelism.

5. The reaction chamber defined in claim 4 wherein said chamber is a plasma enhanced chemical vapor deposition chamber.

* * * * *